United States Patent [19]
Coldren

[11] 4,166,987
[45] Sep. 4, 1979

[54] SURFACE ACOUSTIC WAVE MULTISTRIP COUPLER

[75] Inventor: Larry A. Coldren, Holmdel, N.J.

[73] Assignee: Bell Telephone Laboratories, Incorporated, Murray Hill, N.J.

[21] Appl. No.: 877,838

[22] Filed: Feb. 15, 1978

[51] Int. Cl.$^2$ ............................................. H01P 5/18
[52] U.S. Cl. ............................... 333/109; 333/193; 333/186; 310/313
[58] Field of Search ............... 333/6, 10, 30 R, 72; 310/313

[56] References Cited

U.S. PATENT DOCUMENTS 3,978,437 8/1976 Paige ........................................ 333/72
4,079,342 3/1978 Solie ..................................... 333/30 R Primary Examiner—E. R. LaRoche
Assistant Examiner—Robert E. Wise
Attorney, Agent, or Firm—Ronald D. Slusky

[57] ABSTRACT

The fingers of a multistrip coupler for surface acoustic waves are weighted in at least one, i.e., input or output, track so as to match a predetermined energy profile for that track. In one embodiment, the weighting is achieved by apodizing the fingers of the multistrip coupler. In another embodiment, each finger is formed in a variable-amplitude zig-zag pattern. The invention is particularly advantageous when used to transversely couple surface acoustic wave resonators.

19 Claims, 9 Drawing Figures

SURFACE ACOUSTIC WAVE MULTISTRIP COUPLER

BACKGROUND OF THE INVENTION

The fact that surface acoustic waves will propagate on piezoelectric and other substrates has been exploited in the prior art to provide so-called surface acoustic wave (SAW) devices, which are useful in communications, radar and other signal processing systems. A SAW delay line, for example, may include an input transducer for converting input electrical signals to acoustic wave energy on the substrate and at least one output transducer for converting the acoustic wave energy back to electrical form. The acoustic wave energy propagates relatively slowly, advantageously providing delays of substantial magnitude.

Other kinds of components may be disposed on the substrate to form more complex devices. One such component is the multistrip coupler described, for example, in U.S. Pat. No. 3,836,876 issued to Marshall et al on Sept. 17, 1974, U.S. Pat. No. 3,947,783 issued to Maerfeld on Mar. 30, 1976, and U.S. Pat. No. 3,987,379 issued to DeVries on Oct. 19, 1976. A SAW multistrip coupler is comprised of an array of parallel filamentary conductors, or fingers, and is disposed on the substrate such that it lies within at least two acoustic wave paths, or "tracks". Interaction of the coupler fingers with the acoustic wave energy in one track is such as to transfer at least a portion of that energy to the other track.

SUMMARY OF THE INVENTION

The fingers of prior art multistrip couplers are perpendicular to the acoustic wavefront in each track and are of equal length. In accordance with the present invention, I have recognized that this structure may be less than optimum in some applications.

For example, the prior art SAW multistrip coupler is maximally efficient in transferring SAW energy from one track to another only when the energy of the input wave across the input track, i.e., the energy profile, is uniform. However, in some SAW systems acoustic waves may have nonuniform energy profiles. Moreover, waves exiting from either track of a prior art multistrip coupler are constrained to have an energy profile which is uniform across that track. Disadvantageously, a SAW device which is to receive the multistrip coupler output wave may operate most efficiently only when acoustic waves which are applied to it have some particular nonuniform energy profile.

The above-described drawbacks of known SAW multistrip couplers are avoided in accordance with my invention by weighting the fingers thereof across at least one track so as to match a predetermined nonuniform energy profile for that track. The weighting may be provided in the input track, for example, so as to match the nonuniform energy profile of an input wave. The coupling efficiency of the multistrip coupler is thereby optimized and the energy profile of acoustic waves passing through the multistrip coupler, but remaining in the same track, is preserved. Or, the weighting may be provided in the output track so that acoustic waves coupled into that track by the multistrip coupler have some desired nonuniform energy profile. The weighting may also be provided in both tracks.

In accordance with a feature of the invention, the above-described weighting may be achieved by apodizing the multistrip coupler fingers so that they have active and inactive segments. In particular, the number of active segments at any given point across the track in question is chosen to be a function of the nonuniform input energy profile or a desired nonuniform output energy profile, as the case may be.

In accordance with another feature of the invention, weighting of the multistrip coupler fingers can also be achieved by forming each finger in a variable-amplitude pattern, the amplitude of the pattern at a particular point across the track again being a function of the nonuniform energy profile at that point.

A multistrip coupler weighted in both tracks in accordance with the invention can be used to particular advantage to transversely couple SAW resonators.

BRIEF DESCRIPTION OF THE DRAWING

The invention may be fully understood from a consideration of the following detailed description and accompanying drawing in which.

DETAILED DESCRIPTION

Figure 1:
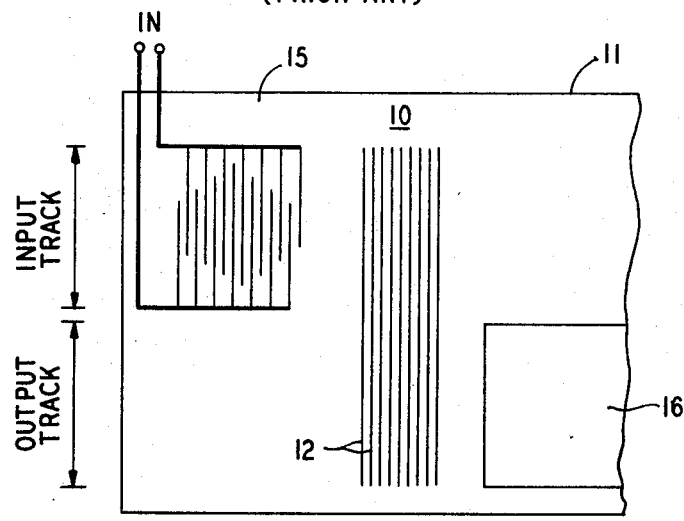
FIG. 1 illustrates a prior art SAW multistrip coupler used as a track changer.

FIG. 1 shows a prior art multistrip coupler 10 disposed on a substrate 11, the latter being comprised of a material on which substrate acoustic waves will propagate. Multistrip coupler 10 is comprised of an array of filamentary conductors, or fingers, 12 formed of an electrically conductive material. The number, width and spacing of the fingers are selected in accordance with well-known design criteria (see, e.g., the above-cited patents) such that a predetermined portion of the input acoustic wave energy propagating along a first, input track, across which the upper half of multistrip coupler 10 is disposed, emerges from the lower half of the multistrip coupler and thereafter continues in a second, output track. Energy in the input track not coupled into the output track continues in the former.

The principle of operation here is that acoustic wave energy impinging on the multistrip coupler fingers in the input track induces charge on the fingers, thereby converting acoustic wave energy to electrical energy which flows along each finger as an electrical current. The electric potential on each finger is a time-varying function, the instantaneous potential on a given finger being related to the integral of the instantaneous SAW intensity, or amplitude, taken over the path defined by that finger. Since time-varying potentials appear on the multistrip coupler fingers in the output track, acoustic energy is launched in that track. Of course energy must be conserved, so that the amount of energy continuing in the input track is given by the multistrip coupler input energy less the energy coupled into the output track.

Figure 2:
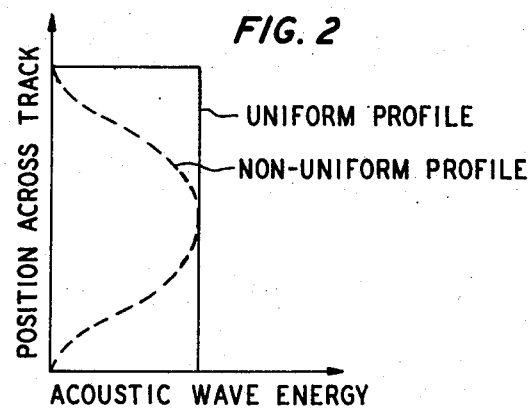
FIG. 2 depicts a uniform SAW energy profile and a typical nonuniform profile.

Fingers 12 of prior art multistrip coupler 10 are all parallel to the acoustic wavefront in each track and are of equal length. An aspect of the present invention is my recognition that this structure may be disadvantageous in some applications. For example, the efficiency of the prior art multistrip coupler in transferring SAW energy from one track to another is less than optimum if the energy profile of acoustic waves in the input track, i.e., average SAW energy as a function of position across the input track, is other than uniform. By way of example, FIG. 2 illustrates a uniform SAW energy profile and a typical nonuniform energy profile.

More particularly, multistrip coupler 10 is used in FIG. 1 as a simple track changer. Surface acoustic waves are launched in the input track by a SAW transducer 15. In this example, as much of the energy in the input track as possible is to be transferred into the output track, where it is received by a SAW waveguide 16. However, as shown in FIG. 1, it may be desirable to weight the fingers of transducer 15 (e.g., by providing them with different lengths) so as to provide the transducer with a particular frequency response. Such weighting, however, will generally provide the input track surface acoustic waves with a nonuniform energy profile. As a result, it is not possible to couple all of the energy in the input track into the output track, no matter how the number, width and spacing of fingers 12 are chosen. Thus, some of the acoustic wave energy in the input track emerges from multistrip coupler 10 still in that track and is irretrievably lost.

A further drawback of the prior art multistrip coupler structure, I have recognized, is that energy which exits from the multistrip coupler in either track is constrained to have a uniform energy profile, independent of the input wave profile. That is, the conventional multistrip coupler redistributes the energy so that a uniform energy profile is provided. The problem here is that the SAW device receiving the multistrip coupler output wave may operate most efficiently only when acoustic waves which are applied to it have some particular nonuniform energy profile. For example, SAW waveguides such as guide 16 provide the least loss and signal distortion when the input wave thereto has an approximate cosine-like profile.

Figure 3:
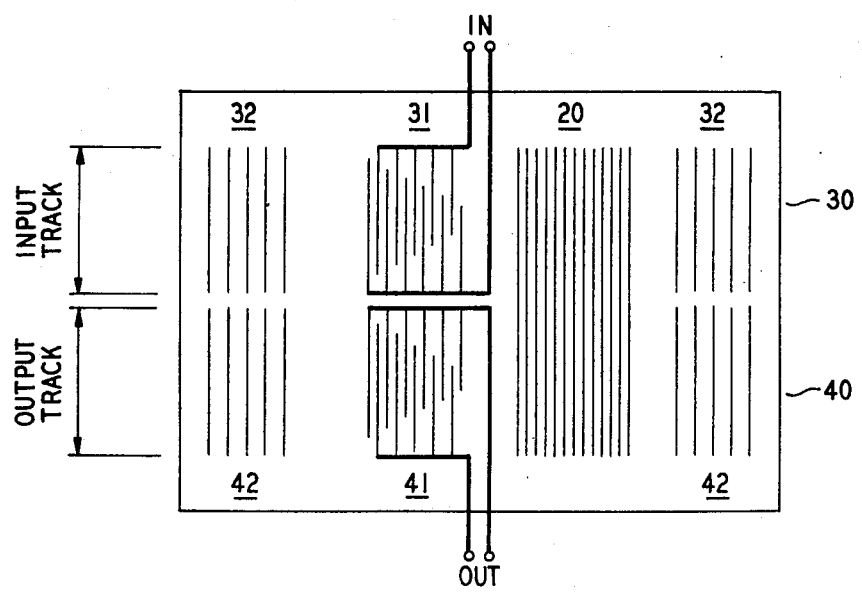
FIG. 3 depicts a prior art SAW multistrip coupler used to transversely couple a pair of SAW resonators.
Figure 4:
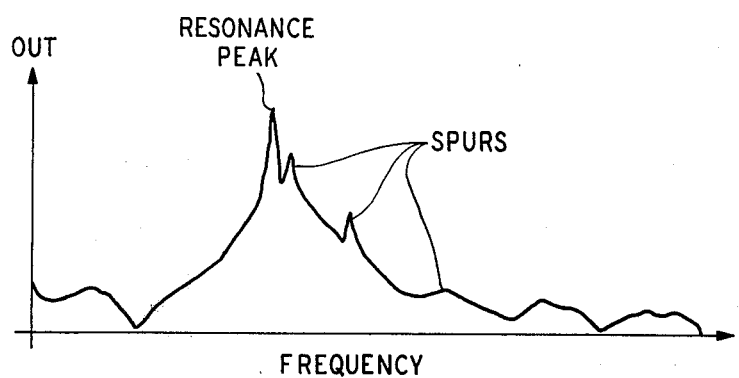
FIG. 4 depicts a typical frequency response curve for the coupled resonator structure of FIG. 3.

The above problems compound themselves in applications such as the transversely coupled resonator structure shown in FIG. 3, another prior art arrangement disclosed, for example, in U.S. Pat. No. 3,886,504 issued to Hartemann et al on May 27, 1975. Here, a multistrip coupler 20 is used to couple energy between a pair of SAW resonators 30 and 40 disposed in input and output tracks, respectively. Resonator 30 includes an input transducer 31 disposed in a so-called resonating cavity defined by a pair of SAW reflectors 32. Transducer 31 converts electrical input signals to acoustic wave energy which propagates to the left and right out to reflectors 32. Most of the surface acoustic wave energy outside a relatively narrow wavelength band passes through the reflectors and out the ends of the device. On the other hand, most of the energy within that band is reflected back into the cavity. A portion of the energy within the cavity of resonator 30 is coupled by multistrip coupler 20 into the cavity of resonator 40, the specific energy portion being determined by the multistrip coupler parameters selected. This coupled energy, in turn, is reflected back and forth within cavity 40 by reflectors 42, and a portion that is converted back to electrical form by transducer 41. Only energy within an even narrower wavelength band than that mentioned above resonates within each resonator, the center wavelength of that band being determined principally by the lengths of the resonator cavities (which are illustratively equal, but need not be). This provides the overall transversely coupled resonator structure with a narrow-band electrical filter transfer characteristic, such as shown in FIG. 4.

Figure 5:
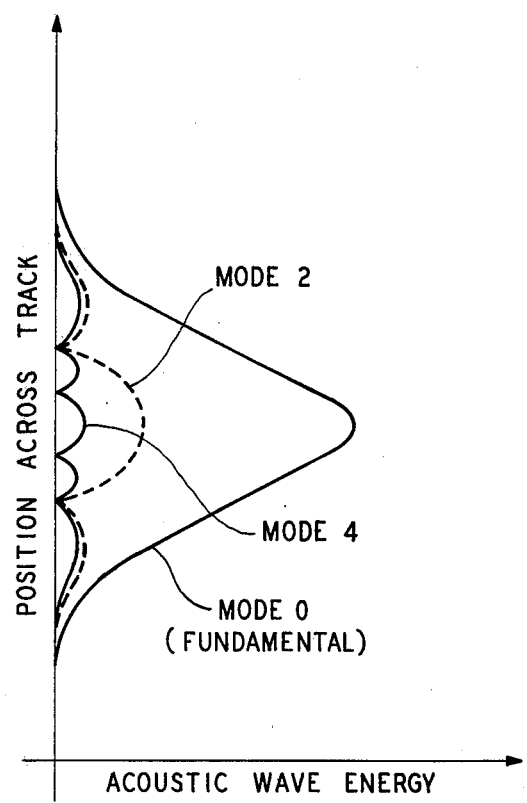
FIG. 5 depicts several SAW resonator propagational modes.

Using conventional multistrip coupler 20 constrains energy coupled into the cavity of resonator 40 to have a uniform energy profile. However, acoustic energy propagates in SAW resonators in so-called even-order waveguide modes (transducers 31 and 41 being weighted in the arrangement of FIG. 3 so as to preferentially excite and be excited by the fundamental, or zero-order, mode). These modes have nonuniform energy profiles, as is illustrated in FIG. 5 for the first three even-order modes. The result is that a combination of fundamental and higher-order waveguide mode components is excited in resonator 40. Initially, the sum of these components is just exactly equal to the uniform energy profile wave introduced into resonator 40. However, the higher-order modes propagate at different velocities, and thus resonate at different frequencies, from the fundamental. The latter resonates the most strongly, its resonant frequency thus constituting the center frequency of the filter characteristic. It will thus be appreciated that less than all of the energy resonating at the center frequency in resonator 30 and coupled into the cavity of resonator 40 appears as resonant energy at the center frequency in the latter. Accordingly, the insertion loss of the overall coupled resonator structure is greater than it would be if the above-described mode conversion did not occur. The problem is further compounded by the fact that any energy in resonator 30 which is not coupled into resonator 40 continues in the input track with a uniform energy profile, as previously described, leading to mode conversion in resonator 30 as well. Furthermore, the multistrip coupler operates bi-directionally, so that a portion of the energy in resonator 40 is coupled back into resonator 30, further compounding the mode conversion and attendant center frequency energy loss. A further problem here is that although the higher-order modes do not resonate as strongly as the fundamental, they do resonate, creating undesirable spurs in the filter characteristic, as indicated in FIG. 4.

The above-described drawbacks of known SAW multistrip couplers are avoided in accordance with my invention by weighting the fingers thereof across at least one track so as to match a predetermined nonuniform energy profile for that track. The weighting may be provided in the input track, for example, so as to match the nonuniform energy profile of an input wave. The coupling efficiency of the multistrip coupler is thereby optimized and the energy profile of acoustic waves passing through the multistrip coupler, but remaining in the same track, is preserved. Or, the weighting may be provided in the output track so that acoustic waves coupled into that track by the multistrip coupler have some desired energy profile.

The weighting may also be provided in both tracks, as is particularly advantageous in applications such as transversely coupled resonator structures of the type shown in FIG. 2. I have found, for example, that the overall insertion loss at the resonance peak of this structure is reduced by approximately 2–3 db when the multistrip coupler is weighted in accordance with the invention. This decrease in insertion loss provided by the present invention becomes particularly important in arrangements in which multistrip couplers are used to couple more than two SAW resonators, such as shown in my paper with R. L. Rosenberg and J. A. Rentschler appearing in IEEE 1977 Ultrasonics Symposium Proceedings, IEEE Cat. #77 CH1264-1SU. Moreover, since higher-order modes are excited to a much smaller degree when a multistrip coupler according to the present invention is used, the spurs shown in FIG. 4 are reduced, providing a cleaner frequency response curve.

Figure 6:
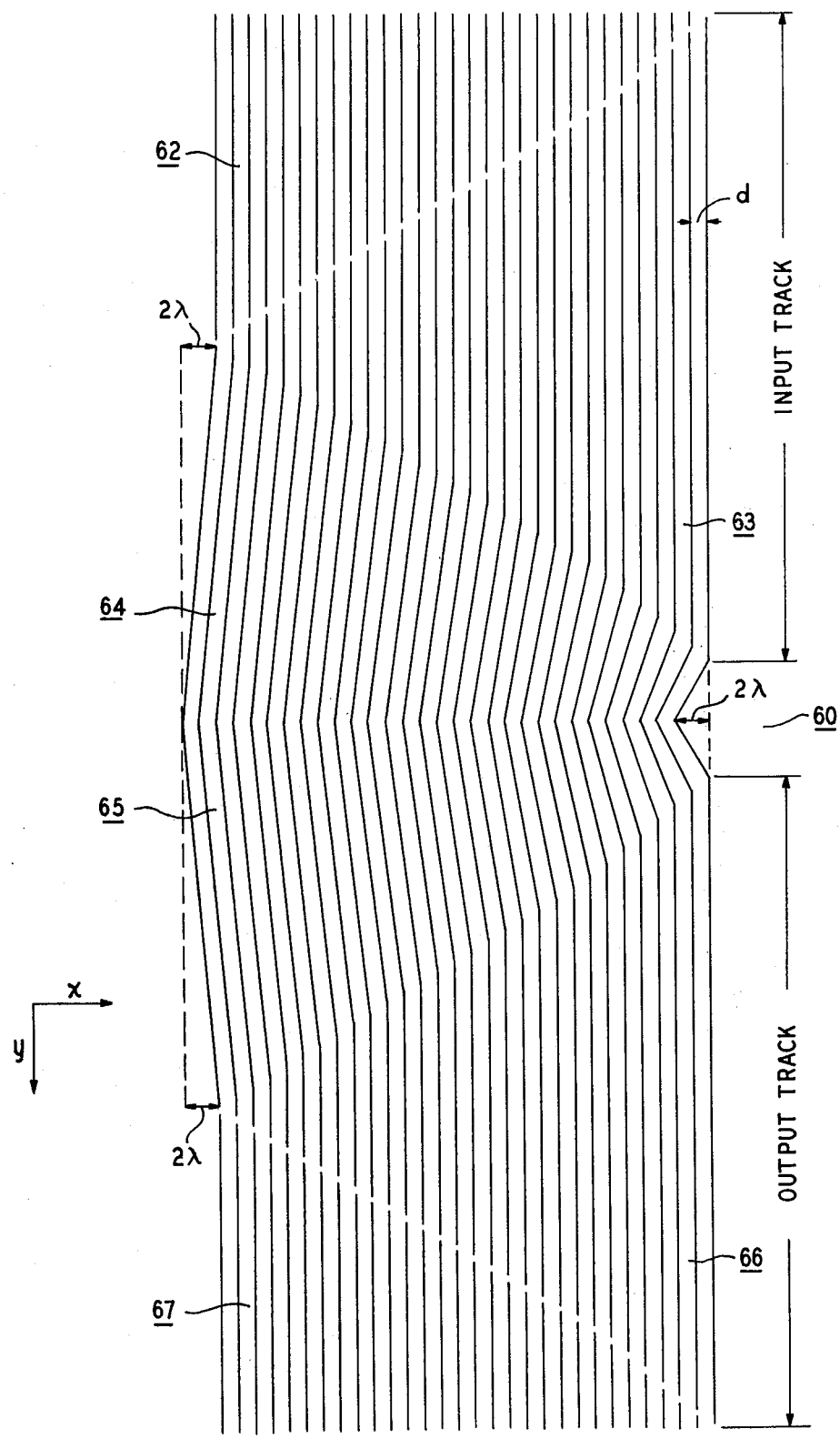
FIG. 6 shows a SAW multistrip coupler weighted in accordance with the first above-mentioned feature of the invention.

In accordance with a feature of the invention, the above-described weighting may be achieved by apodizing the multistrip coupler fingers so that they have active and inactive segments. In particular, the number of active segments at any given point across the track in question is chosen to be a function of the nonuniform input energy profile or a desired nonuniform output energy profile, as the case may be. This approach is shown in FIG. 6, in which the fingers of a multistrip coupler 60 are illustratively weighted in both tracks.

More particularly, multistrip coupler 60 has three distinct regions in the input track, each region comprising respective segments of the multistrip coupler fingers. The finger segments in region 62 are electrically discontinuous from the rest of multistrip coupler 60. Therefore, all of the SAW energy converted to electrical energy in region 62 is reconverted to SAW energy in that same region. No net energy can be coupled out of, i.e. removed from, the input wave as it passes through region 62 since there is nowhere for that energy to be delivered. As a result, region 62 is substantially invisible to the input wave. The segments of region 62 do, however, serve a useful function by ensuring that waves passing through the multistrip coupler are delayed therein uniformly across the track.

Region 64 (which extends beyond the input track to connect the input and output portions of the multistrip coupler) is also substantially invisible to the input wave. This may be understood from the following: The amount of energy coupled out of the input wave by any segment in region 64 (or region 63 discussed below) is a function of the contribution from that segment to the net potential on the finger of which it is a part. The contribution from a segment, in turn, is determined by integrating the instantaneous SAW intensity, or magnitude, along the path defined by the segment. Each of the finger segments in region 64 is angled such that the difference between the x (horizontal) coordinates of its end points is an integral number of (illustratively two) wavelengths, $\lambda$, of the (assumed narrowband) waves passing through the multistrip coupler. As a result, the above-mentioned integral is always zero. Thus, the contribution to net finger potential from the segment is zero and no SAW energy is extracted from the wave as it passes through this region. (If desired, the segments of region 62—as well as those of region 67 discussed below—may likewise be angled by an integral number of wavelengths to minimize any transverse spreading, i.e., vertical propagation, of energy within that region. Such propagation may tend to distort the waveform.)

Multistrip coupler 60 does, however, couple energy out of the input track in region 63. As in conventional multistrip couplers, the finger segments in this region are parallel to the acoustic wavefronts and are electrically continuous with finger segments in the output track. The amount of energy absorbed at any point across the track is a function of the number of lines in region 63, i.e., active finger segments, through which the wave passes at that point. Thus, providing the number of active fingers at any given point across the track i.e., at a given y (vertical) value as a function of the nonuniform energy profile in that track ensures that the percentage of energy removed from the input wave is uniform across the track. Advantageously, this allows the multistrip coupler to be so configured that substantially all of the input energy is coupled to the output track if such is desired for a given application, e.g., simple track changing. If, alternatively, less than all of the input energy is to be coupled to the output track, as is the case in a coupled resonator structure, for example, this weighting advantageously ensures that the profile of the wave which emerges from the multistrip coupler in the input track is the same as that which enters the multistrip coupler, avoiding mode conversion in the input track.

It will be appreciated from the foregoing that multistrip coupler 60 is weighted in the input track so as to match a surface acoustic wave which has more of its energy at the center and less at the edges. The output half of the multistrip coupler is illustratively a mirror image of the upper half so that it matches the same mode. More particularly, since region 67 is electrically isolated from the rest of multistrip coupler 60, it does not carry the time-varying electrical potentials generated in response to the above-described coupling of acoustic energy out of the input track. Thus no SAW energy is launched from region 67.

Region 65 does carry those potentials. However, in order for surface acoustic waves to be launched from region 65 along some propagational path, there must be a so-called "phase match" between regions 63 and 65. That is, the distance between the segments in region 65 along a propagation path therein must be equal to the distance, d, which separates the segments of region 63 (assuming equal SAW propagation velocities in the two regions). Such a path in region 65, however, is, of necessity, not perpendicular to the segments therein due to the fact that the latter are angled. As a result, any SAW energy launched from a given segment of region 65 will interfere destructively with that launched from other segments in region 65 and as long as the multistrip coupler has more than, say, 10–20 fingers (a typical number might be 350 fingers), there will be no net energy launched from region 65 in any direction. (The only possible exception is that for a nonisotropic substrate, the SAW propagation velocity along a path perpendicular to the segments in region 65 may be different from that in region 63 such that phase matching between regions 63 and 65 does occur. In this unlikely event, a slight alteration of one or two of the multistrip coupler design parameters or use of a different substrate should avoid the problem.)

The finger segments in region 66 comprise the active segments for the output portion of the multistrip coupler. The amount of energy coupled into the output track at a given point thereacross is determined by the number of segments in region 66 at that point, i.e., the width of region 66 (measured in the x direction). Thus, in complement to the input track weighting, the weighting illustrated for the output track in FIG. 6 provides a nonuniform output energy profile which is strongest at the center and weakest at the edges.

Weighting a multistrip coupler in accordance with the above teachings cannot, unfortunately, be achieved simply by shaping its active region so as to mimic the desired nonuniform energy profile. That is, the fraction of energy coupled out of or onto a track at a given point across the track is not a linear function of the number of active finger segments at that point. This is because the nonactive intermediate regions of the multistrip coupler, e.g., regions 64 and 65 in FIG. 6, capacitively load the active regions. This loading is more severe for the shorter active segments (which have longer associated inactive segments). The result is that proportionately more active finger segments are required where the energy profile being matched is strong than where it is weak.

In particular, although active regions 63 and 66 of multistrip coupler 60 are somewhat generally triangular, they, in fact, match the rounded, generally cosiner fundamental mode of a SAW resonator, as shown in FIG. 5.

A quantitative design procedure which takes the above-mentioned capacitive loading into account will now be described. The input and output portions of the multistrip coupler are presumed to be mirror images of each other. Thus, once a geometric description of the multistrip coupler in either track is arrived at, the design problem is essentially solved.

Figure 7:
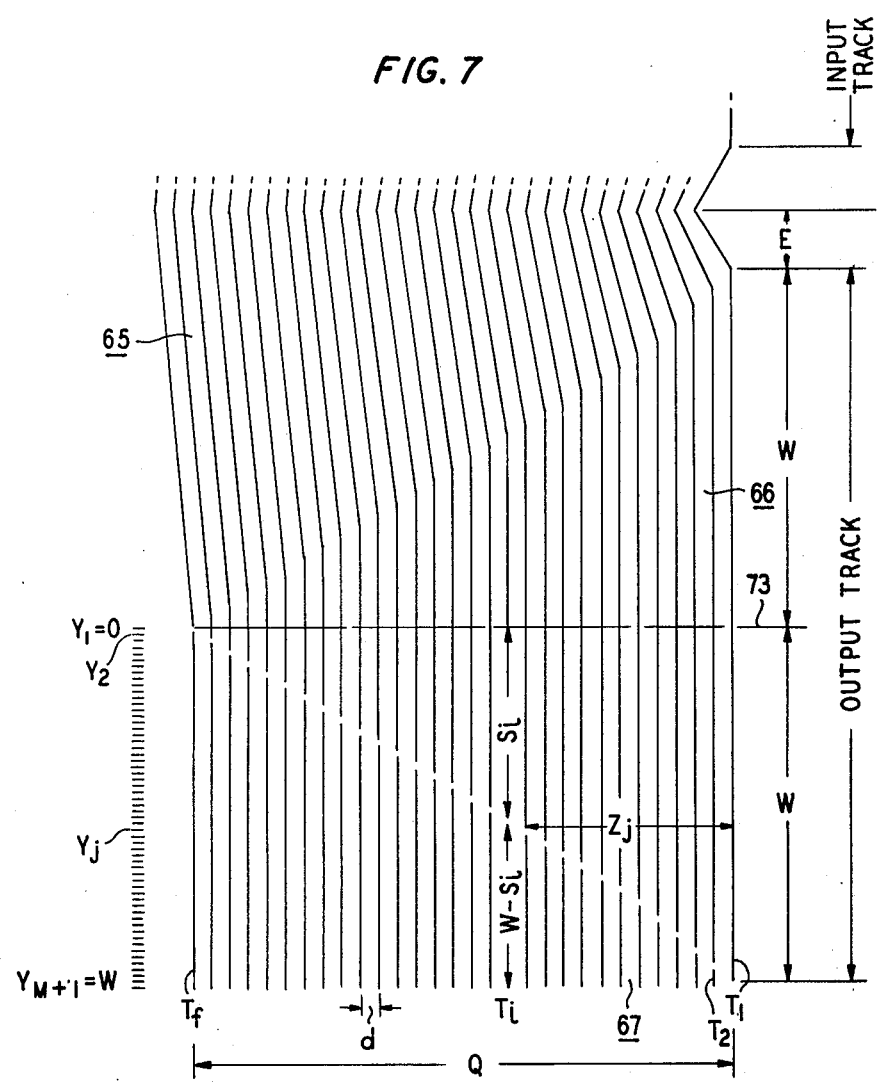
FIG. 7 shows a portion of the same SAW multistrip coupler with its design parameters defined.

As shown in FIG. 7, the output section has been chosen as the basis for designing the multistrip coupler. The width of the output track is 2W and the width of the multistrip coupler is Q. The fingers, $T_i$, of the multistrip coupler are spaced a distance d apart. Position across the track is measured along the y axis, with y=0 being at the track center, defined by axis 73. The latter also defines the direction of principal SAW propagation. Values along the y axis increase in a downward direction from the origin. A plurality of M+1 equispaced sample points are defined along the y axis, so that the y coordinate of the $j^{th}$ sample point, (j=1→M+1) is $$Y_j = \frac{W(j-1)}{M},$$

where M is chosen such that $(Y_j - Y_{j-1}) << d$, e.g., (0.1)d.

Further, we define a discrete function $B_j$ indicating the value at $Y_j$ of the energy profile to be matched. The maximum $B_j$ is normalized to Q for computational convenience. An energy profile in the shape of a cosine superimposed on a pedestal—the approximate profile of the fundamental mode of a SAW resonator—is presumed for this example, so that $$B_j = \frac{Q}{(1+C)} [\cos(3/4\pi Y_j/W) + C],$$

where, typically, $C = \cos(\pi/4)$. As also shown in FIG. 7, $Z_j$ is a discrete function defining that width of active region 66 at $Y_j$ which is required to achieve the desired $B_j$. An initial, trial set of $Z_j$'s is assumed by, in this example, assuming the line of discontinuity between regions 66 and 67 to be a straight line. Therefore, $$Z_j = \frac{Q}{M}(M+1-j).$$

In carrying out the design procedure, a new, updated value of each $Z_j$, denoted $\bar{Z}_j$, is now computed individually for each value of j by finding the smallest value of r for which $$B_j < \frac{Q}{P} \sum_{k=1}^{r} \frac{Z_{k+1} - Z_k}{1 + [L_k/2]}. \quad (1)$$

Here $L_k$ is a factor which takes into account the above-described capacitive loading and is given by $L_k \approx (W - Y_k + E)/Y_k$, E being half the intertrack distance, and P, defined as $$P \equiv \sum_{k=1}^{M+1} \frac{Z_{k+1} - Z_k}{1 + [L_k/2]}, \quad (2)$$

being a normalizing factor introduced so that, as predetermined, $Z_j = B_j = Q$ for $j=1$.

Once r is determined, $\bar{Z}_j$ is given as $\bar{Z}_j = Z_r$.

Thus, for example, if (1) is not satisfied for j=299, r=292, but is satisfied for r=293, then $\bar{Z}_{299} = Z_{293}$. The summation in (1) represents the contribution to the output energy at $Y_j$ over the width of active region 66. Expressions (1) and (2) thus, in effect, answer the question, "How wide should region 66 be at $Y_j$ to provide the desired $B_j$?".

The parameter P has a meaning in addition to that given above. In all multistrip couplers, the percent of input energy coupled into the output track is a function of, inter alia, the maximum width of the active region of the coupler, e.g., the width Q. The above-cited patents, for example, set forth appropriate design criteria for arriving at that width. A multistrip coupler weighted in accordance with the invention, as described above, couples a factor of P/Q less energy into the center of the output track for the same multistrip coupler width due to the capacitive loading. Therefore, in order to provide a desired coupling in the present multistrip coupler, the latter should be made Q/P times wider than the known design equations for prior art multistrip couplers would specify.

Once all the new $\bar{Z}_j$'s have been calculated, they are used in place of the old $Z_j$'s and the procedure represented by (1) and (2) is continually repeated for all j's until the $Z_j$'s converge, i.e., do not change significantly from one iteration to the next, as determined by the requirements of the design application. The number of fingers, $N_j$, to be provided in active region 66 at $Y_j$ is determined by dividing $Z_j$ by d and then truncating the quotient. A portion of a typical table of values of j, $Y_j$, $Z_j$ (final values), $Z_j/d$ and $N_j$ is shown below.

| j | $Y_j (\mu m)$ | $Z_j (\mu m)$ | $Z_j/d$ (d=10$\mu$m) | $N_j$ | Finger No. (i) |
|---|---|---|---|---|---|
| . | . | . | . | . | . |

-continued

| j | $Y_j$ (μm) | $Z_j$ (μm) | $Z_j/d$ (d=10μm) | $N_j$ | Finger No. (i) |
|---|---|---|---|---|---|
| . | . | . | . | . | . |
| . | . | . | . | . | . |
| . | . | . | . | . | . |
| 803 | 448.4 | 646.3 | 64.63 | 64 | — |
| 802 | 447.2 | 650.4 | 65.04 | 65 | 65 |
| 801 | 446.0 | 653.8 | 65.38 | 65 | — |
| 800 | 444.8 | 657.1 | 65.71 | 65 | — |
| 799 | 443.6 | 660.9 | 66.09 | 66 | 66 |
| 798 | 442.4 | 663.9 | 66.39 | 66 | — |
| 797 | 441.2 | 666.7 | 66.67 | 66 | — |
| 796 | 440.0 | 671.1 | 67.11 | 67 | 67 |
| . | . | . | . | . | . |
| . | . | . | . | . | . |
| . | . | . | . | . | . |
| 1 | 0.0 | 1200.1 | 120.01 | 120 | 120 |

The half-length, $S_i$ of the segment of finger $T_i$ in active region 66 is determined from the above table by finding the largest j for which $N_j=i$, whereby $S_i=Y_j$. Thus, for example, as shown in the "finger number" column of the above table, the segment of finger $T_{65}$ in region 66 has a length 894.4 μm (i.e., 2×447.2 μm). The length of the segment of finger $T_i$ in region 67 is given by $(W-S_i)$. The length of each segment in region 65 is not crucial, it being whatever is necessary to interconnect the segments of the same finger in regions 64 and 66. This length will obviously depend on how far the input and output tracks are spaced from one another. The finger segments in regions 62, 63 and 64 (FIG. 6) have the same lengths as those in regions 67, 66 and 65, respectively. With all the line segment lengths thus computed, a photolithography mask can then be generated via conventional techniques for ultimate fabrication of the multistrip coupler.

Figure 8:
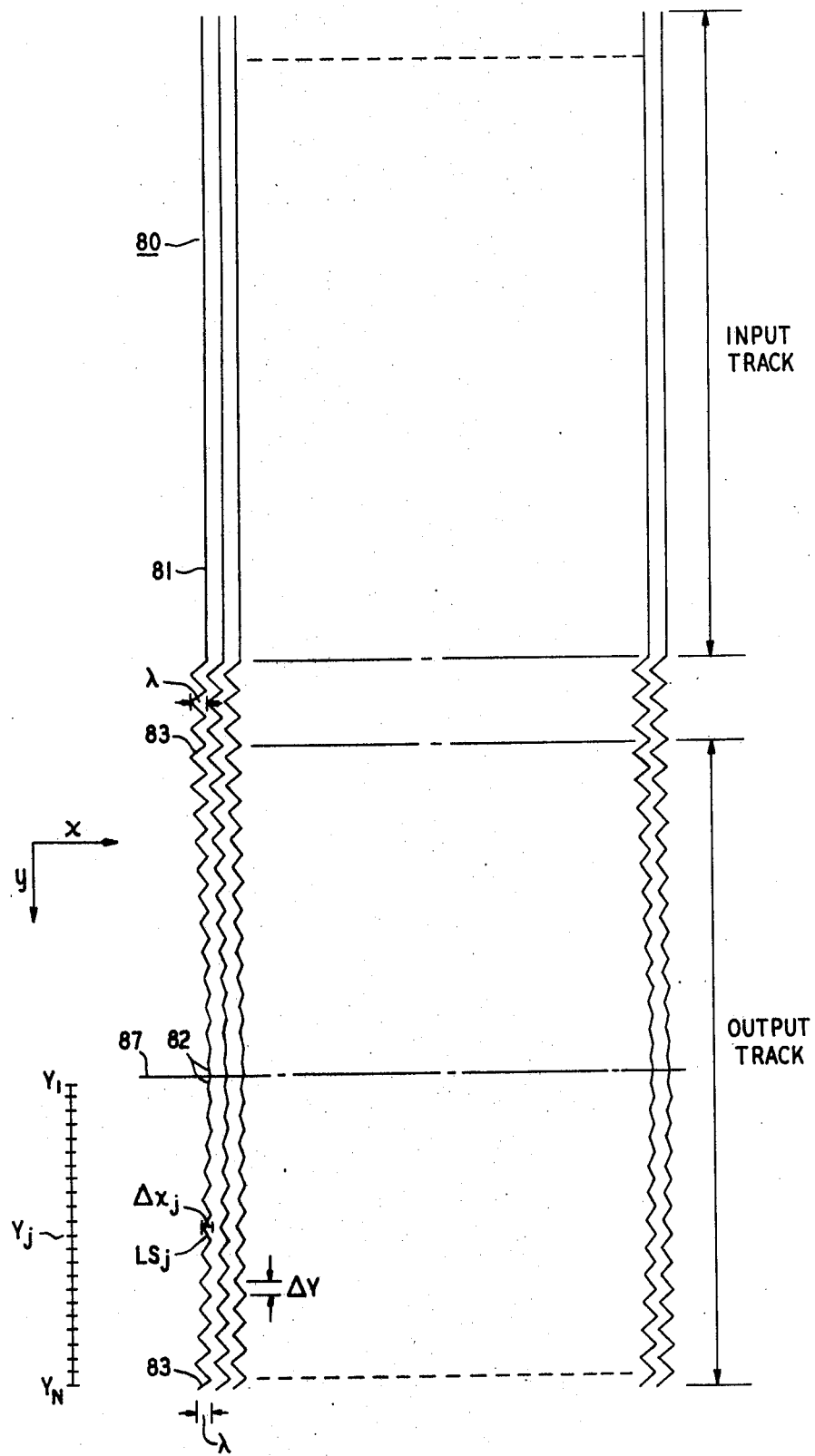
FIG. 8 shows a SAW multistrip coupler weighted in accordance with the second above-mentioned feature of the invention.

Weighting of the multistrip coupler fingers in accordance with the invention can also be achieved by forming each finger in a variable-amplitude pattern in the x direction, the amplitude of the pattern at particular values of y being a function of the nonuniform energy profile at that point across the track. This approach is shown in FIG. 8 in which the fingers of a multistrip coupler 80 are illustratively weighted in the output track only. The multistrip coupler 80 is thus adapted to couple uniform energy profile surface acoustic waves in the input track into surface acoustic waves in the output track having some predetermined nonuniform energy profile.

In particular, it will be noted that each finger of multistrip coupler 80 is illustratively comprised of a plurality of segments in the output track, the segments being arranged in a variable-amplitude zig-zag pattern. Again, the SAW resonator fundamental mode is illustratively the profile being matched. Thus, the two segments on either side of the center of the output track, e.g., segments 82 of the left-most finger 81, are perpendicular to the longitudinal axis 87 of the track. Thus, multistrip coupler 80 couples the same fraction of input energy to the center of the output track as would a conventional multistrip coupler.

The difference between the x co-ordinates of the segments at the edges of the track, e.g. segments 83, is an integral number of wavelengths—illustratively one wavelength, λ. Thus, the above-described integration and destructive interference phenomena ensure that substantially no energy is launched into the output track at its extremes. The difference between the x co-ordinates of the segments intermediate the edges of the track and its center is somewhere between zero and λ so as to provide the desired weighting.

More particularly, for any desired weighting profile, the following equation is solved for $\Delta x_j$, defined as the difference between the endpoints of the $j^{th}$ segment $LS_j$ (which has its midpoint at $Y_j$):

$$B_j = \frac{\sin(\pi \Delta x_j/\lambda)}{(\pi \Delta x_j/\lambda)}. \quad (3)$$

Here, again, $B_j$ is the value at $Y_j$ of the profile to be matched, but now normalized to unity. Table look-up or any other convenient solution technique can be employed in solving (3) for $\Delta x_j$. (The parameter $\Delta x_j$ can also be viewed as the length of the projection of segment $LS_j$ on axis 87, the latter being a line defining the direction of principal SAW propagation.)

The controlling criterion in determining how many segments each finger should include is that the energy profile to be matched should not change drastically over any $\Delta y$ interval, i.e., the interval along the y axis between the endpoints of any segment. In matching the SAW resonator fundamental mode, for example, one hundred segments in each weighted track would be typical.

Yet another technique for varying the fraction of energy extracted from the input track or launched into the output track along each finger is to use straight, continuous fingers as in the prior art, but raise each finger from the piezoelectric substrate a varying amount along the length of the finger as a function of the nonuniform energy profile to be matched. This, in turn, may be accomplished by disposing a variable-thickness dielectric layer on the substrate and depositing the multistrip coupler fingers on the dielectric. The thickness, $h_j$, of the dielectric at a point $Y_j$ is then given by $$h_j = -\frac{1}{\gamma} \ln(B_j),$$

where $\gamma$ is the exponential decay constant of the electric potential from the surface and, again, $B_j$ is the magnitude at $Y_j$ of the profile to be matched, normalized to unity.

Figure 9:
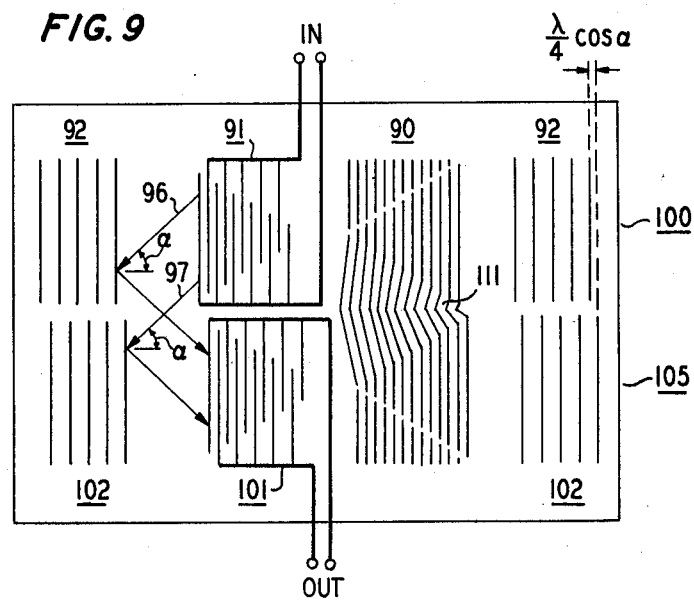
FIG. 9 shows a transversely coupled SAW resonator structure in accordance with an aspect of the present invention.

FIG. 9 illustrates a further aspect of my invention, relating to transversely coupled resonator structures of the type shown in FIG. 3. In particular, FIG. 9 depicts a pair of SAW resonators 100 and 105 having input and output transducers 91 and 101, respectively, and SAW reflector pairs 92 and 102, respectively. Resonators 100 and 105 are coupled by way of multistrip coupler 90.

It has been tacitly assumed to this point that all of the acoustic wave energy launched by the input transducer, for example, of a SAW resonator propagates perpendicular to the transducer fingers, i.e., along the input track axis. In fact, however, some energy is launched in other directions, and a portion of this is reflected by the SAW gratings directly to the output transducer. Two such reflective paths 96 and 97 are shown in FIG. 9. Path 96 reflects off the left-hand grating 92, while path 97 reflects off the left-hand grating 102. In fact, for every reflective path off the left-hand grating 92 there is a reflective path off the left-hand grating 102. In conventional transversely coupled SAW resonators, the two paths of each such reflective path pair are of equal length. They thus combine additively at the output transducer. Since this reflected energy is not subject to any filtering in either resonator, the result is the introduction of unwanted, off-resonance energy in the output spectrum.

As illustrated in FIG. 9, this problem is avoided in accordance with an aspect of the invention by offsetting one resonator with respect to the other by a distance $\lambda/4 \cos \alpha$, where $\alpha$ is the angle of reflection. In this way, the total path length of off-axis waves reflecting off grating 92 is made to differ by $\lambda/2$ from the total path length of the off-axis waves reflecting off grating 102. These waves thus tend to cancel at output transducer 101. The offsetting of the resonators with respect to each other necessitates a similar offsetting of the lower portion of multistrip coupler 90 with respect to the upper portion thereof. In FIG. 9, multistrip coupler 90 is illustratively weighted in accordance with the invention, although it need not be. It may be noted in this regard that although the offsetting of the lower portion of the multistrip coupler will cause the inactive segments in region 111 to have a pitch which is not exactly an integral number of wavelengths, the above-described integration and destructive interference criteria are substantially fulfilled.

Although specific embodiments of my invention are shown and described herein, it will be appreciated that these are merely illustrative. It is anticipated that other arrangements embodying the principles of the invention and lying within its spirit and scope may be readily devised by those skilled in the art.

What is claimed is:

1. A surface acoustic wave (SAW) device comprising,
   a substrate comprised of a material on which surface acoustic waves will propagate, and
   a multistrip coupler disposed on said substrate for coupling surface acoustic waves having a predetermined energy profile and propagating in a first acoustic wave track on said substrate into surface acoustic waves having a desired energy profile and propagating in a second acoustic wave track on said substrate, respective portions of said coupler lying in said first and second tracks and the energy profile of the waves in at least one of said tracks being nonuniform,
   characterized in that the portion of said coupler lying in said one of said tracks is weighted to match said nonuniform energy profile.

2. The invention of claim 1 wherein said multistrip coupler includes a plurality of conductive fingers, each of said fingers including at least first and second interconnected segments lying in said one of said tracks, said first segment being perpendicular to the direction of principal SAW propagation in said one of said tracks and having a length selected as a function of said nonuniform energy profile and said second segment being other than perpendicular to said axis.

3. The invention of claim 2 wherein each of said fingers further includes at least a third segment which lies in said one of said tracks and which is electrically isolated from said first segment and at least a fourth segment lying in the other of said tracks electrically connected to said second segment.

4. The invention of claim 2 wherein the length of each said first segment is selected such that the number of first segments through which said nonuniform energy profile waves pass at any particular point across said one of said tracks is a function of the energy of said nonuniform profile waves at said point.

5. The invention of claim 1 wherein said multistrip coupler includes a plurality of conductive fingers, each of said fingers including a plurality of segments lying in said one of said tracks, at least individual ones of said segments being other than perpendicular to the direction of principal SAW propagation in said one of said tracks.

6. The invention of claim 5 wherein the distance $\Delta x_j$ between the endpoints of the $j^{th}$ of said segments measured along said principal direction of SAW propagation is selected as a function of said nonuniform energy profile.

7. The invention of claim 6 wherein said function is $$B_j = \frac{\sin (\pi \Delta x_j/\lambda)}{(\pi \Delta x_j/\lambda)},$$

where $B_j$ is the value of said nonuniform energy profile substantially at the midpoint of said $j^{th}$ segment, normalized to unity, and $\lambda$ is a selected wavelength for said waves in said one of said tracks.

8. In combination,
   a substrate,
   means for launching a surface acoustic wave in a first path on said substrate, and
   a multistrip coupler including a plurality of conductive fingers disposed on said substrate for coupling said wave from said first path into a second path on said substrate,
   said multistrip coupler characterized in that each of said fingers follows a path which deviates from a straight line path in a variable-amplitude manner.

9. The invention of claim 8 wherein said wave has a nonuniform energy profile in said one of said paths, wherein each of said fingers is comprised of a plurality of segments formed in a variable-amplitude zig-zag pattern, the projection of the $j^{th}$ of said segments onto a line defining the direction of principal SAW propagation in said one of said paths having an amplitude $\Delta x_j$, and wherein $$B_j = \frac{\sin (\pi \Delta x_j/\lambda)}{(\pi \Delta x_j/\lambda)}$$

where $B_j$ is the energy of said wave, normalized to unity, at substantially the midpoint of said $j^{th}$ segment.

10. In combination,
   a substrate,
   means for launching a surface acoustic wave in a first path on said substrate, and
   a multistrip coupler including a plurality of conductive fingers disposed on said substrate for coupling said wave from said first path into a second path on said substrate,
   said multistrip coupler characterized in that each of said fingers is comprised of at least first through third segments lying in one of said paths and a fourth segment lying in the other of said paths, said first segment being perpendicular to a line defining the direction of principal SAW propagation in said first of said paths, said second segment being other than perpendicular to said line, said first, second and fourth segments being electrically continuous with one another and electrically discontinuous from said third segment, and at least individual ones of said fingers having respective first segments of different lengths.

11. The invention of claim 10 wherein said wave has a nonuniform energy profile in said one of said paths and wherein the length of said first segment is such that the number of first segments through which said wave passes at any point across said path is a function of the energy of said wave at said point.

12. A surface acoustic wave (SAW) resonator arrangement comprising
a substrate of a material on which surface acoustic waves will propagate,
first and second SAW resonators each including a pair of SAW reflectors disposed on said substrate so as to form first and second SAW resonating cavities each having a longitudinal axis, and
a SAW multistrip coupler having respective portions lying in said first and second cavities, respectively, such that a predetermined fraction of SAW energy in one of said cavities is coupled into the other of said cavities
characterized in that at least the portion of said multistrip coupler lying in said first cavity is weighted to match the energy profile of the fundamental mode of said first resonator.

13. The invention of claim 12 wherein said first and second resonators further include first and second SAW transducers, respectively, each of said transducers being adapted to couple between electrical energy and SAW energy.

14. The invention of claim 12 wherein said multistrip coupler includes a plurality of conductive fingers, each of the fingers in said portion being comprised of at least first and second segments, said first segment being perpendicular to the longitudinal axis of said first cavity and said second segment being other than perpendicular thereto.

15. The invention of claim 14 wherein the length of said first segment is selected as a function of the energy profile of said fundamental mode.

16. The invention of claim 15 wherein the longitudinal axes of said first and second cavities are substantially parallel to one another and wherein each of the reflectors of said first resonator are offset longitudinally from a corresponding reflector of said second resonator.

17. The invention of claim 12 wherein said multistrip coupler includes a plurality of conductive fingers, each of said fingers including a plurality of segments, the projection of the $j^{th}$ one of said segments on the longitudinal axis of said first cavity having an amplitude $\Delta x_j$, and wherein $$B_j = \frac{\sin(\pi \Delta x_j/\lambda)}{(\pi \Delta x_j/\lambda)}$$

where $B_j$ is the strength of said fundamental mode substantially at the midpoint of said $j^{th}$ one of said segments, normalized to unity, and $\lambda$ is the fundamental resonant wavelength for said first resonator.

18. The invention of claim 17 wherein the longitudinal axes of said first and second cavities are substantially parallel to one another and wherein each of the reflectors of said first resonator are offset longitudinally from a corresponding reflector of said second resonator.

19. A surface acoustic wave (SAW) resonator arrangement comprising
a substrate of a material on which surface acoustic waves will propagate,
first and second SAW resonators each including a pair of SAW reflectors disposed on said substrate so as to form first and second SAW resonating cavities, said cavities having respective longitudinal axes which are parallel to one another, and
means for coupling a predetermined fraction of SAW energy in one of said cavities into the other of said second cavities, each of the reflectors of said first resonator being offset longitudinally from a corresponding reflector of said second resonator.

* * * * *